(12) United States Patent
Qi

(10) Patent No.: US 12,289,976 B2
(45) Date of Patent: Apr. 29, 2025

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventor: Puyu Qi, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 406 days.

(21) Appl. No.: 17/770,265

(22) PCT Filed: Jun. 15, 2021

(86) PCT No.: PCT/CN2021/100054
§ 371 (c)(1),
(2) Date: Apr. 19, 2022

(87) PCT Pub. No.: WO2021/254315
PCT Pub. Date: Dec. 23, 2021

(65) Prior Publication Data
US 2022/0384529 A1 Dec. 1, 2022

(30) Foreign Application Priority Data
Jun. 15, 2020 (CN) .......................... 202010544337.4

(51) Int. Cl.
*H10K 59/38* (2023.01)
*H10K 50/86* (2023.01)
*H10K 59/35* (2023.01)

(52) U.S. Cl.
CPC ........... *H10K 59/38* (2023.02); *H10K 50/865* (2023.02); *H10K 59/35* (2023.02)

(58) Field of Classification Search
None
See application file for complete search history.

(56) References Cited

U.S. PATENT DOCUMENTS

2016/0351631 A1\* 12/2016 Lee
2020/0127061 A1\* 4/2020 Zou
2021/0405475 A1 12/2021 Tang

FOREIGN PATENT DOCUMENTS

CN 108279523 A 7/2018
CN 110060651 A 7/2019
(Continued)

OTHER PUBLICATIONS

Albert J.P. Theuwissen, "Encyclopedia of Physical Science and Technology (Third Edition)", p. 324, section A. Aperture Ratio of Pixels (Year: 2003).\*

(Continued)

*Primary Examiner* — Yara B Green
*Assistant Examiner* — Tessa Elizabeth McNamee
(74) *Attorney, Agent, or Firm* — IPro, PLLC

(57) ABSTRACT

The present disclosure provides a display substrate and a display device. The display substrate includes a transparent display region and a non-transparent display region, the transparent display region includes a first sub-pixel array including a red sub-pixel, a green sub-pixel, a blue sub-pixel and a transparent sub-pixel, the non-transparent display region includes a second sub-pixel array including a red sub-pixel, a green sub-pixel and a blue sub-pixel, and an aperture ratio of the blue sub-pixel in the first sub-pixel array is less than an aperture ratio of the blue sub-pixel in the second sub-pixel array. A filter unit and a black matrix are arranged at a light-emitting side of each of the red sub-pixels, the green sub-pixels and the blue sub-pixels in the first sub-pixel array and the second sub-pixel array, each black matrix is arranged between two filter units and shields (Continued)

a part of the filter unit, and an orthogonal projection of a part of the filter unit not shielded by the black matrix onto a light-emitting coincides with the red sub-pixels, the green sub-pixels and the blue sub-pixels in the first sub-pixel array and the second sub-pixel array.

10 Claims, 2 Drawing Sheets

(56) References Cited

FOREIGN PATENT DOCUMENTS

| | | | | | |
|---|---|---|---|---|---|
| CN | 110676301 | A | * | 1/2020 | ........... H01L 27/322 |
| CN | 111081752 | A | | 4/2020 | |
| CN | 111158182 | A | | 5/2020 | |
| CN | 111640776 | A | | 9/2020 | |
| KR | 20180079104 | A | * | 7/2018 | |

OTHER PUBLICATIONS

Machine translation of CN-110676301-A (Year: 2020).*
Machine translation of KR-20180079104-A (Year: 2018).*
CN 202010544337.4 first office action.
PCT/CN2021/100054 international search report and written opinion.

* cited by examiner

DISPLAY SUBSTRATE AND DISPLAY DEVICE

CROSS-REFERENCE TO RELATED APPLICATION

This application is the U.S. national phase of PCT Application No. PCT/CN2021/100054 filed on Jun. 15, 2021, which claims a priority of the Chinese patent application No. 202010544337. 4 filed on Jun. 15, 2020, which is incorporated herein by reference in its entirety.

TECHNICAL FIELD

The present disclosure relates to the field of display technology, in particular to a display substrate and a display device.

BACKGROUND

At present, for an organic light-emitting display device, external light is reflected by a metallic cathode, so the visibility of a display screen is low outdoors. Generally, the reflection of the external light by the metallic cathode is reduced through attaching a circular polarizer, but due to high cost and low transmittance of the polarizer, such problems as high screen power consumption and a short service life may occur. A color filter structure may be formed on a packaging layer to replace the circular polarizer. Through simulation, a transmittance of color filter structure is about 60%, with a great improvement as compared with a transmittance of the circular polarizer.

On the other hand, a screen-to-body ratio of consumer goods such as mobile terminals in the current market is increasingly demanded, and in order to increase the screen-to-body ratio, a display panel is provided with a transparent display region for displaying and collecting images simultaneously. Apart from red-green-blue (RGB) sub-pixels, a transparent sub-pixel is also arranged in the display region, and an element for collecting the images is arranged under the transparent sub-pixel. An area of the transparent display region for emitting light, i.e., a weak display region, is less than an area of a normal display region, so a brightness value of the transparent display region is less than that of the other regions in the display screen. At this time, such a phenomenon as mura may occur for the display screen.

SUMMARY

In one aspect, the present disclosure provides in some embodiments a display substrate, including a transparent display region and a non-transparent display region. The transparent display region includes a first sub-pixel array, the first sub-pixel array includes a red sub-pixel, a green sub-pixel, a blue sub-pixel and a transparent sub-pixel, the non-transparent display region includes a second sub-pixel array, the second sub-pixel array includes a red sub-pixel, a green sub-pixel and a blue sub-pixel, and an aperture ratio of the blue sub-pixel in the first sub-pixel array is smaller than an aperture ratio of the blue sub-pixel in the second sub-pixel array.

In a possible embodiment of the present disclosure, a filter unit and a black matrix are arranged at a light-emitting side of each of the red sub-pixels, the green sub-pixels and the blue sub-pixels in the first sub-pixel array and the second sub-pixel array, each black matrix is arranged between two filter units and shields a part of the filter unit, and an orthogonal projection of a part of the filter unit not shielded by the black matrix onto a light-emitting layer coincides with the red sub-pixels, the green sub-pixels and the blue sub-pixels in the first sub-pixel array and the second sub-pixel array.

In a possible embodiment of the present disclosure, the filter units include red color filter blocks, blue color filter blocks and green color filter blocks corresponding to the red sub-pixels, the blue sub-pixels and the green sub-pixels in the first sub-pixel array and the second sub-pixel array respectively, and a light transmittance of the blue color filter block in the transparent display region is greater than a light transmittance of the blue color filter block in the non-transparent display region.

In a possible embodiment of the present disclosure, a thickness of the blue color filter block in the transparent display region is less than a thickness of the blue color filter block in the non-transparent display region.

In a possible embodiment of the present disclosure, a color concentration of the blue color filter block in the transparent display region is less than a color concentration of the blue color filter block in the non-transparent display region.

In a possible embodiment of the present disclosure, a thickness of the blue color filter block in the transparent display region is 1 µm to 2 µm, and a thickness of the blue color filter block in the non-transparent display region is 2 µm to 4 µm.

In a possible embodiment of the present disclosure, the aperture ratio of the blue sub-pixel in the transparent display region is 85% of the aperture ratio of the blue sub-pixel in the non-transparent display region.

In a possible embodiment of the present disclosure, the display substrate further includes a back plate away from a light-emitting direction of a light-emitting layer, and an image collection unit is arranged at a side of the back plate away from the light-emitting layer and located in an orthogonal projection of the transparent display region onto the back plate.

In a possible embodiment of the present disclosure, an aperture ratio of the transparent sub-pixel is 5% to 10%.

In a possible embodiment of the present disclosure, an aperture ratio of the red sub-pixel in the first sub-pixel array is the same as an aperture ratio of the red sub-pixel in the second sub-pixel array, an aperture ratio of the green sub-pixel in the first sub-pixel array is the same as an aperture ratio of the green sub-pixel in the second sub-pixel array, a light transmittance of the red color filter block in the transparent display region is the same as a light transmittance of the red color filter block in the non-transparent display region, and a light transmittance of the green color filter block in the transparent display region is the same as a light transmittance of the green color filter block in the non-transparent display region.

In another aspect, the present disclosure provides in some embodiments a display device including the above-mentioned display substrate.

BRIEF DESCRIPTION OF THE DRAWINGS

In order to illustrate the technical solutions of the embodiment of the present disclosure in a clearer manner, the drawings desired for the embodiment of the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments.

It should be appreciated that, unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
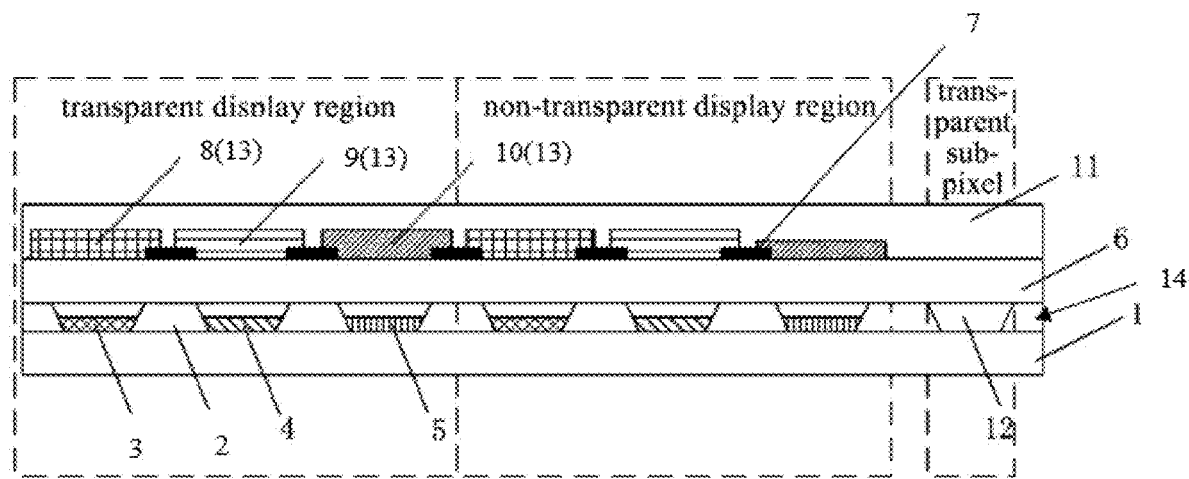
FIG. 1 is a schematic view showing a display substrate according to one embodiment of the present disclosure.

The present disclosure provides in some embodiments a display substrate which, as shown in FIG. 1, includes a back plate 1, a pixel definition layer (PDL) 3, a light-emitting layer 14 provided with a red sub-pixel 2, a green sub-pixel 4, a blue sub-pixel 5 and a transparent sub-pixel 12, a packaging layer 6, a black matrix layer 7, a filter layer provided with a red color filter block 8, a green color filter block 9 and a blue color filter block 10, and a cover film 11 from bottom to top.

The packaging layer 6 is arranged in a light-emitting direction (a direction away from the back plate 1 in FIG. 1) of the light-emitting layer 14, and a black matrix 7 and the filter layer are arranged at a side of the packaging layer 6 away from the light-emitting layer 14.

The light-emitting layer 14 may include, for example, a red sub-pixel, a green sub-pixel, and a blue sub-pixel made of an Electro Luminescence (EL) material to achieve a light-emitting function. The EL material is evaporated at a position corresponding to the transparent sub-pixel, and when no power is applied, the transparent sub-pixel is in a transparent state. Alternatively, no EI material is evaporated at the position corresponding to the transparent sub-pixel, so that the transparent sub-pixel is in the transparent state. Hence, the transparent sub-pixel in the embodiments of the present disclosure may be understood as a transparent sub-region.

Figure 2:
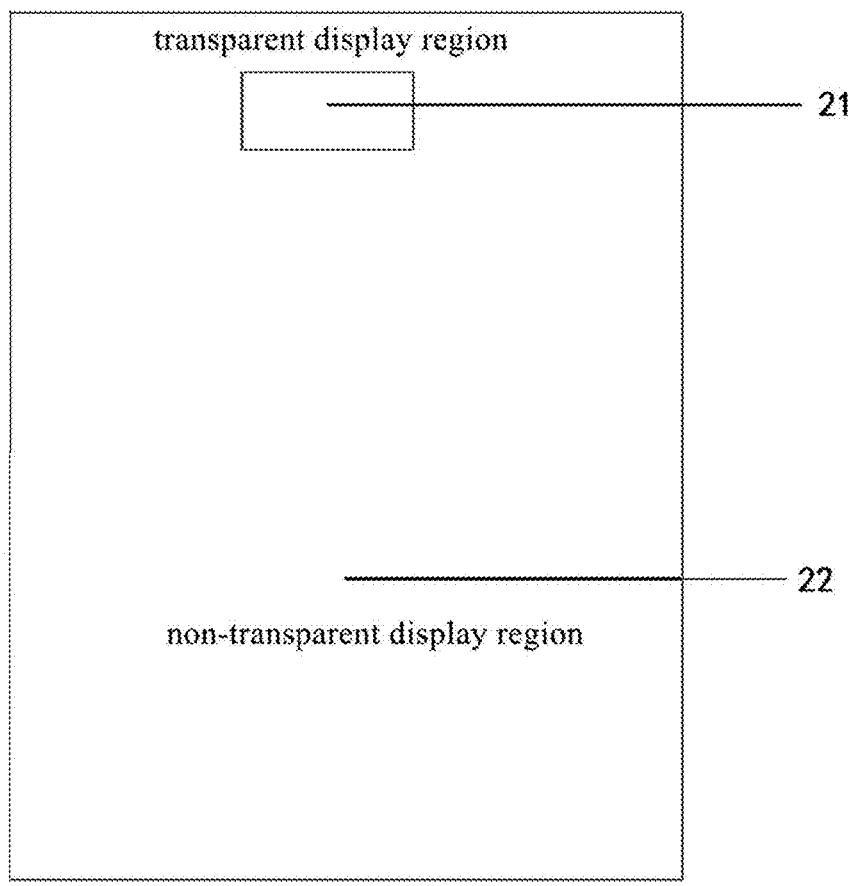
FIG. 2 is a schematic view showing a transparent display region and a non-transparent display region on a display screen according to one embodiment of the present disclosure.

The display substrate includes a transparent display region and a non-transparent display region. For example, at least a part of the transparent display region is surrounded by the non-transparent display region. The transparent display region may be a display region with a length and a width of not more than 5 mm in the middle of a display screen, and the display region may normally achieve a display function like the other display region of the display screen as well as an image collection function. In a possible embodiment of the present disclosure, FIG. 2 shows the transparent display region and the non-transparent display region on the display screen, where the transparent display region 21 is of a rectangular shape. However, in the embodiments of the present disclosure, the transparent display region 22 may also be of a circular shape, an oval shape or a triangular shape.

The transparent display region includes a first sub-pixel array, the first sub-pixel array includes a red sub-pixel, a green sub-pixel, a blue sub-pixel and a transparent sub-pixel, the non-transparent display region includes a second sub-pixel array, the second sub-pixel array includes a red sub-pixel, a green sub-pixel and a blue sub-pixel, and an aperture ratio of the blue sub-pixel in the first sub-pixel array is less than an aperture ratio of the blue sub-pixel in the second sub-pixel array.

A filter unit 13 and a black matrix are arranged at a light-emitting side of each of the red sub-pixels, the green sub-pixels and the blue sub-pixels in the first sub-pixel array and the second sub-pixel array, each black matrix is arranged between two filter units 13 and shields a part of the filter unit 13, and an orthogonal projection of a part of the filter unit 13 not shielded by the black matrix onto the light-emitting layer 14 coincides with the red sub-pixels, the green sub-pixels and the blue sub-pixels in the first sub-pixel array and the second sub-pixel array.

In the embodiments of the present disclosure, the black matrix and the filter layer are formed on the packaging layer to serve as a polarizer layer, thereby to reduce the reflection of external light by a metallic cathode in an organic light-emitting display device.

Figure 3:
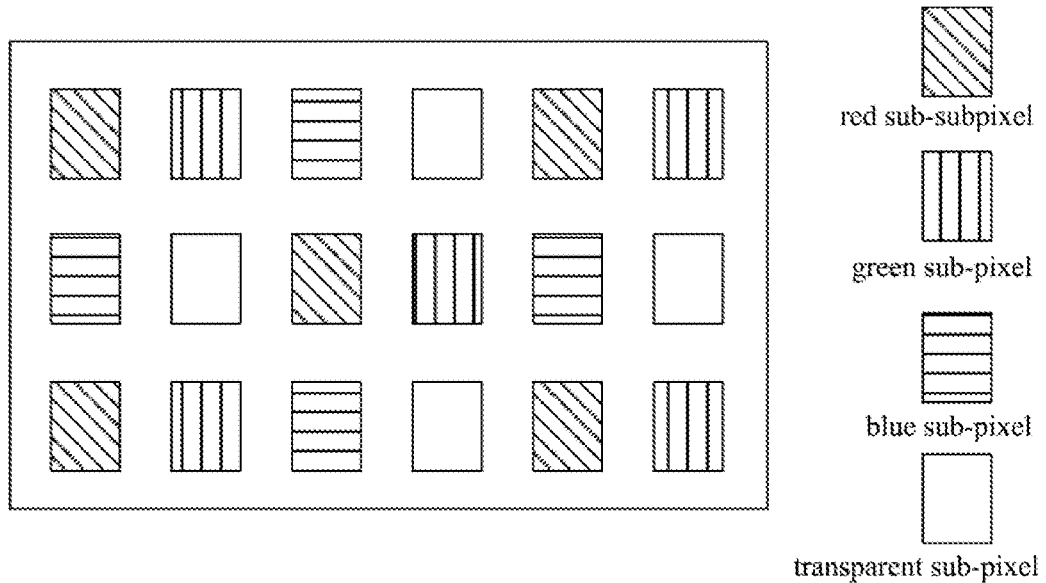
FIG. 3 is a schematic view showing the distribution of sub-pixels in the transparent display region according to one embodiment of the present disclosure.

In the embodiments of the present disclosure, FIG. 3 shows the distribution of the red sub-pixel, the green sub-pixel, the blue sub-pixel and the transparent sub-pixel in the transparent display region, and the sub-pixel array in FIG. 3 may be a minimum repeatable unit constituting a pixel array in the transparent display region.

Figure 4:
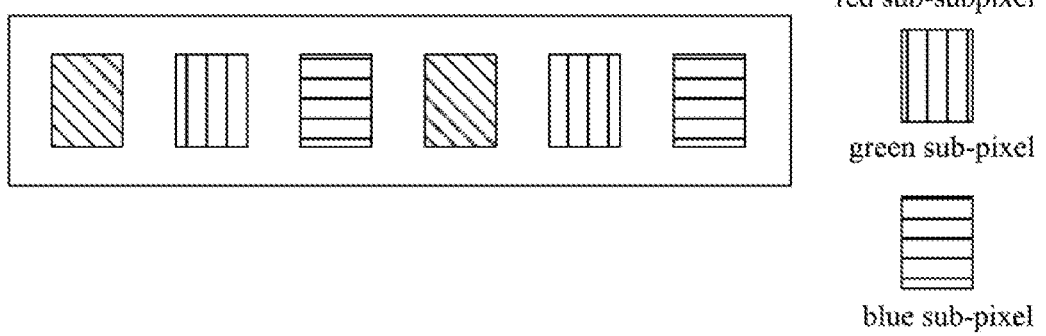
FIG. 4 is a schematic view showing the distribution of sub-pixels in the non-transparent display region according to one embodiment of the present disclosure.

In the embodiments of the present disclosure, FIG. 4 shows the distribution of the sub-pixels in the non-transparent display region, and the sub-pixel array in FIG. 4 may be a minimum repeatable unit constituting a pixel array in the non-transparent display region.

In the embodiments of the present disclosure, merely the aperture ratio of the blue sub-pixel in the transparent display region is reduced without any change in the aperture ratio of the other sub-pixels in the transparent display region and the non-transparent display region. The red sub-pixel and the green sub-pixel have great contribution to a brightness value of the display screen, so after the aperture ratio of the blue sub-pixel in the transparent region has been reduced, there is a relatively small change in the brightness value in the transparent display region, i.e., it is able to reduce a brightness difference between the transparent display region and the non-transparent display region.

In the embodiments of the present disclosure, the plurality of filter units 13 includes red color filter blocks, blue color filter blocks and green color filter blocks corresponding to the red sub-pixels, the blue sub-pixels and the green sub-pixels respectively, and a light transmittance of the blue color filter block in the transparent display region is greater than a light transmittance of the blue color filter block in the non-transparent display region. For example, the red color filter block is arranged on a surface of the packaging layer at a position opposite to an orthogonal projection of the red sub-pixel in the first sub-pixel array onto the packaging layer, the greed color filter block is arranged on a surface of the packaging layer at a position opposite to an orthogonal projection of the greed sub-pixel in the first sub-pixel array onto the packaging layer, and the blue color filter block is arranged on a surface of the packaging layer at a position opposite to an orthogonal projection of the blue sub-pixel in the first sub-pixel array onto the packaging layer. Correspondingly, the red color filter block is arranged on a surface of the packaging layer at a position opposite to an orthogonal projection of the red sub-pixel in the second sub-pixel array onto the packaging layer, the greed color filter block is arranged on a surface of the packaging layer at a position opposite to an orthogonal projection of the greed sub-pixel in the second sub-pixel array onto the packaging layer, and the blue color filter block is arranged on a surface of the packaging layer at a position opposite to an orthogonal projection of the blue sub-pixel in the second sub-pixel array onto the packaging layer. Still taking the display substrate in FIG. 1 as an example, in the non-transparent display region, the aperture ratio of the red sub-pixel, the aperture ratio of the green sub-pixel and the aperture ratio of the blue sub-pixel are AR(R1), AR(G1) and AR(B1) respectively, and a thickness of the red color filter block, a thickness of the green color filter block and a thickness of the blue color filter block are d(R1), d(G1) and d(B1) respectively; in the transparent display region, the aperture ratio of the red sub-pixel, the aperture ratio of the green sub-pixel and the aperture ratio of the blue sub-pixel are AR(R2), AR(G2) and AR(B2) respectively, and a thickness of the red color filter block, a thickness of the green color filter block and a thickness of the blue color filter block are d(R2), d(G2) and d(B2) respectively. At this time, AR(R1)=AR(R2), AR(G1)=AR(G2), AR(B1)>AR(B2), d(R1)=d(R2), d(G1)=d(G2), and d(B1)>d(B2).

In the embodiments of the present disclosure, still taking the display substrate in FIG. 1 as an example, the thickness of the blue color filter block in the transparent display region is less than the thickness of the blue color filter block in the non-transparent display region, or the thickness of the red color filter block in the transparent display region is the same as the thickness of the red color filter block in the non-transparent display region and the thickness of the green color filter block in the transparent display region is the same as the thickness of the green color filter block in the non-transparent display region. As shown in FIG. 1, the thickness of the green color filter block in the transparent display region may also be the same as the thickness of the red color filter block in the display region, and the thickness of the green color filter block in the non-transparent display region may also be the same as the thickness of the red color filter block in the display region. Still taking the display substrate in FIG. 1 as an example, the thickness of the blue color filter block in the transparent display region is reduced to improve a light transmittance of blue light, so as to enable chromaticity in the transparent display region to be the same as chromaticity in a common display region, thereby to prevent the occurrence of a yellowish image in the transparent display region.

In the embodiments of the present disclosure, a color concentration of the blue color filter block in the transparent display region is less than a color concentration of the blue color filter block in the non-transparent display region. For example, a color concentration of the red color filter block is the same as a color concentration of the green color filter block in the transparent display region, or the color concentration of the red color filter block and the green color filter block in the transparent display region are the same as that of the red color filter block, the green color filter block, and the blue color filter block in the non-transparent display region.

As described above, different light transmittances of the color filter blocks may be achieved through different color concentrations, or through adjusting the thicknesses of the color filter blocks. For example, when the light transmittance of the blue color filter block in the transparent display region needs to be greater than the light transmittance of the blue color filter block in the non-transparent display region, the blue color filter block with a lower color concentration may be used in the transparent display region, or the same blue color filter block as that in the non-transparent display region may be used, but the thickness of the blue color filter block in the transparent display region is less than the thickness of the blue color filter block in the non-transparent display region. When the blue color filter block with a lower color concentration is used in the transparent display region, an additional mask needs to be provided, which results in a complicated process. When the thickness of the blue color filter block in the transparent display region is reduced, it is unnecessary to provide any additional mask and process, and it is merely necessary to replace a common mask with a halftone mask.

In the embodiments of the present disclosure, a thickness of the blue color filter block in the transparent display region is 1 μm to 2 μm, and a thickness of the blue color filter block in the non-transparent display region is 2 μm to 4 μm. Further, a thickness of the red color filter block, a thickness of the green color filter block and a thickness of the blue color filter block in the non-transparent display region are all 2 μm to 4 μm, and a thickness of the red color filter block and a thickness of the green color filter block in the transparent display region are both 2 μm to 4 μm.

In the embodiments of the present disclosure, the aperture ratio of the blue sub-pixel in the transparent display region is 85% of the aperture ratio of the blue sub-pixel in the non-transparent display region. Table 1 shows simulation results of the display substrate when the aperture ratio of the blue sub-pixel in the transparent display region has not been reduced and when the aperture ratio of the blue sub-pixel in the transparent display region has been reduced. When the aperture ratio of the blue sub-pixel in the transparent display region is reduced to 85% of the aperture ratio of the blue sub-pixel in the non-transparent display region, a change in the total transmittance of the display substrate may be controlled within (62%-61.1%)/61.1%=1.5% through adjusting the thickness of the blue color filter block in the transparent display region. This change is too weak to be recognized by human eyes. In addition, a change in the chromaticity of a white image is only (0.001, 0.002), and when a monochromatic image is displayed, a change in the chromaticity of a blue image is only (0, 0.002). Identically, these changes are too weak to be recognized by human eyes. Hence, a brightness difference between the transparent display region and the non-transparent display region on the display substrate is small, thereby it is able to achieve uniform brightness.

TABLE 1

|  | non-transparent display region | transparent display region |
|---|---|---|
| AR(R) | 8.7% | 8.7% |
| AR(G) | 10.5% | 10.5% |
| AR(B) | 21.0% | 17.8% |
| d(R) | 3 μm | 3 μm |
| d(G) | 3 μm | 3 μm |
| d(B) | 3 μm | 1.5 μm |
| Total Tr % | 61.1% | 62.0% |
| Wx | 0.326 | 0.327 |
| Wy | 0.399 | 0.401 |
| Bx | 0.139 | 0.139 |
| By | 0.041 | 0.043 |

In the embodiments of the present disclosure, the display substrate further includes a back plate away from a light-emitting direction of the light-emitting layer 14, and an image collection unit is arranged at a side of the back plate away from the light-emitting layer 14 in an orthogonal projection of the transparent display region onto the back plate. No color filter is arranged on the transparent sub-pixel of the display substrate, so the image collection unit may be arranged in the transparent display region to achieve an under-screen camera function, i.e., to collect an image. At this time, the display screen has a normal display function as well as an image collection function in the transparent display region.

In the embodiments of the present disclosure, an aperture ratio of the transparent sub-pixel is 5% to 10%.

In the embodiments of the present disclosure, the aperture ratio of the red sub-pixel in the first sub-pixel is the same as the aperture ratio of the red sub-pixel in the second sub-pixel, and the aperture ratio of the green sub-pixel in the first sub-pixel is the same as the aperture ratio of the green sub-pixel in the second sub-pixel, i.e., the aperture ratio of the red sub-pixel in the transparent display region is the same as the aperture ratio of the red sub-pixel in the non-transparent display region, and the aperture ratio of the green sub-pixel in the transparent display region is further the same as the aperture ratio of the green sub-pixel in the non-transparent display region. Still taking the data in Table 1 as an example, the aperture ratio of the red sub-pixel in the transparent display region and the aperture ratio of the red sub-pixel in the non-transparent display region may be 8.7%, and the aperture ratio of the green sub-pixel in the transparent display region and the aperture ratio of the green sub-pixel in the non-transparent display region may be 10.5%. In addition, a light transmittance of the red color filter block in the transparent display region is the same as a light transmittance of the red color filter block in the non-transparent display region, and a light transmittance of the green color filter block in the transparent display region is the same as a light transmittance of the green color filter block in the non-transparent display region. The red sub-pixel and the green sub-pixel have great contribution to the brightness value of the display screen, so the aperture ratio of the red sub-pixel in the transparent display region is arranged to be the same as the aperture ratio of the red sub-pixel in the non-transparent display region, the aperture ratio of the green sub-pixel in the transparent display region is arranged to be the same as the aperture ratio of the green sub-pixel in the non-transparent display region, the light transmittance of the red color filter block in the transparent display region is arranged to be the same as the light transmittance of the red color filter block in the non-transparent display region, and the light transmittance of the green color filter block in the transparent display region is arranged to be the same as the light transmittance of the green color filter block in the non-transparent display region. In this way, it is able to provide a small brightness difference between the transparent display region and the non-transparent display region.

In the embodiments of the present disclosure, the black matrix and the color filter layer (an example of the above filter layer) may be made of a low-temperature curable material, e.g., the black matrix and the color filter layer may be directly formed on the packaging layer through coating, exposing and developing.

In the embodiments of the present disclosure, an orthogonal projection of the black matrix layer onto an evaporation layer is located in an overlapping region of the PDL and does not go beyond an edge of the PDL.

The present disclosure further provides in some embodiments a display device, which includes the above-mentioned display substrate.

The specific embodiments have been described hereinabove, and the other embodiments also shall fall within the scope defined by the appended claims. In some cases, the actions or steps in the appended claims are executed in an order different from that mentioned in the embodiments of the present disclosure, with an expected result too. In addition, the process in the drawings is not necessarily to be performed in a given order or performed continuously to achieve the expected result. In some embodiments of the present disclosure, multitasking or parallel processing is also adopted or possibly advantageous.

In addition, for clarification and for ease of understanding, any known power source/ground end coupled to the Integrated Circuit (IC) and the other members is shown or not shown in the drawings. In addition, the device is shown in the form of a block diagram, so as to facilitate the understanding of the present disclosure, and take the fact that the details about the implementation of the device shown in the block diagram depend on a platform for implementing the present disclosure into consideration (i.e., these details shall completely fall within the capability of a person skilled in the art). In the case that the specific details (e.g., the circuit) has been given to describe the embodiments of the present disclosure, it is obvious to a person skilled in the art that the present disclosure is also capable of being implemented without these specific details or with any change in these specific details, so the description shall be of a merely illustrative but in no way restrictive nature.

Although the above description has been given in conjunction with the embodiments, it will be apparent to a person skilled in the art to make any substitution, alteration and modification based on the above description. For example, any other memory architecture (e.g., Dynamic RAM (DRAM)) is also applied to the discussed embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a transparent display region and a non-transparent display region, wherein at least a part of the transparent display region is surrounded by the non-transparent display region, the transparent display region comprises a first sub-pixel array, the first sub-pixel array comprises a red sub-pixel, a green sub-pixel, a blue sub-pixel and a transparent sub-pixel, the non-transparent display region comprises a second sub-pixel array, the second sub-pixel array comprises a red sub-pixel, a green sub-pixel and a blue sub-pixel, and an aperture ratio of the blue sub-pixel in the first sub-pixel array is smaller than an aperture ratio of the blue sub-pixel in the second sub-pixel array;

wherein the display substrate further comprises a back plate and a packaging layer, a light-emitting layer with the first sub-pixel array and the second sub-pixel array is located on the back plate, and a light-emitting side of the light-emitting layer is far away from the back plate; the packaging layer is arranged at the light-emitting side of the light-emitting layer, a plurality of filter units and black matrices are arranged at the light-emitting side of the light-emitting layer, the plurality of filter units and black matrices are located on a side of the packaging layer away from the light-emitting layer, each of the plurality of filter units corresponds to each of the red sub-pixels, the green sub-pixels and the blue sub-pixels in the first sub-pixel array and the second sub-pixel array, each of the plurality of black matrices is arranged between two filter units and overlaps with a part of two filter units, and an orthogonal projection of a part of each of the plurality of filter units that does not overlap with the black matrices onto the light-emitting layer coincides with the corresponding red sub-pixel, the green sub-pixel or the blue sub-pixel in the first sub-pixel array or the second sub-pixel array;

wherein the plurality of filter units comprise red color filter blocks, blue color filter blocks and green color filter blocks corresponding to the red sub-pixels, the blue sub-pixels and the green sub-pixels in the first sub-pixel array and the second sub-pixel array respectively, each of the plurality of filter units corresponds to one of the red color filter block, blue color filter block or green color filter block, and a light transmittance of the blue color filter block in the transparent display region is greater than a light transmittance of the blue color filter block in the non-transparent display region;

wherein an aperture ratio of the red sub-pixel in the first sub-pixel array is the same as an aperture ratio of the red sub-pixel in the second sub-pixel array, an aperture ratio of the green sub-pixel in the first sub-pixel array is the same as an aperture ratio of the green sub-pixel in the second sub-pixel array, a light transmittance of the red color filter block in the transparent display region is the same as a light transmittance of the red color filter block in the non-transparent display region, and a light transmittance of the green color filter block in the transparent display region is the same as a light transmittance of the green color filter block in the non-transparent display region.

2. The display substrate according to claim 1, wherein a thickness of the blue color filter block in the transparent display region is less than a thickness of the blue color filter block in the non-transparent display region.

3. The display substrate according to claim 1, wherein a thickness of the blue color filter block in the transparent display region is 1 µm to 2 µm, and a thickness of the blue color filter block in the non-transparent display region is 2 µm to 4 µm.

4. The display substrate according to claim 1, wherein the aperture ratio of the blue sub-pixel in the transparent display region is 85% of the aperture ratio of the blue sub-pixel in the non-transparent display region.

5. The display substrate according to claim 1, wherein an aperture ratio of the transparent sub-pixel is 5% to 10%.

6. A display device, comprising the display substrate according to claim 1.

7. The display device according to claim 6, wherein a thickness of the blue color filter block in the transparent display region is less than a thickness of the blue color filter block in the non-transparent display region.

8. The display device according to claim 6, wherein a thickness of the blue color filter block in the transparent display region is 1 µm to 2 µm, and a thickness of the blue color filter block in the non-transparent display region is 2 µm to 4 µm.

9. The display device according to claim 3, wherein the aperture ratio of the blue sub-pixel in the transparent display region is 85% of the aperture ratio of the blue sub-pixel in the non-transparent display region.

10. The display device according to claim 3, wherein an aperture ratio of the transparent sub-pixel is 5% to 10%.

* * * * *